US006081185A

United States Patent [19]
Portet

[11] Patent Number: 6,081,185
[45] Date of Patent: Jun. 27, 2000

[54] MOTOR VEHICLE EQUIPPED WITH A SYSTEM FOR DETECTING THE APPROACH OF A USER

[75] Inventor: Vincent Portet, Yonval, France

[73] Assignee: Valeo Securite Habitacle, Creteil, France

[21] Appl. No.: 09/190,132

[22] Filed: Nov. 12, 1998

[30] Foreign Application Priority Data

Nov. 24, 1997 [FR] France .................................. 97 14718

[51] Int. Cl.$^{7}$ .................................................. H03D 13/00
[52] U.S. Cl. ...................................... 340/426; 340/825.31
[58] Field of Search .................................... 340/426, 561, 340/562, 563, 564, 565, 547, 825.31, 825.34, 825.54; 341/33

[56] References Cited

U.S. PATENT DOCUMENTS

| | | | |
|---|---|---|---|
| 2,708,746 | 5/1955 | Shaw | 340/258 |
| 3,276,005 | 9/1966 | Quist et al. | 340/258 |
| 4,208,695 | 6/1980 | Noda et al. | 340/562 |
| 4,796,013 | 1/1989 | Yasuda et al. | 340/562 |
| 5,394,292 | 2/1995 | Hayashida | 340/435 |
| 5,760,688 | 6/1998 | Kasai | 340/561 |

FOREIGN PATENT DOCUMENTS

| | | |
|---|---|---|
| 0 610 902 A2 | 8/1994 | European Pat. Off. . |
| 0 735 219 A2 | 10/1996 | European Pat. Off. . |
| 0 816 597 A1 | 1/1998 | European Pat. Off. . |
| 0 831 194 A1 | 3/1998 | European Pat. Off. . |
| 95 04353 | 10/1996 | France . |
| 42 26 053 A1 | 2/1993 | Germany . |
| 44 09 167 C1 | 6/1995 | Germany . |
| 196 17 038 A1 | 11/1997 | Germany . |
| WO 88/05950 | 8/1988 | WIPO . |

OTHER PUBLICATIONS

Search Report, EPO 98 40 2881 dated Feb. 19, 1999.

*Primary Examiner*—Jeffery A. Hofsass
*Assistant Examiner*—Daniel Previl
*Attorney, Agent, or Firm*—Pollock, Vande Sande & Amernick

[57] ABSTRACT

Motor vehicle equipped with a system for detecting the approach of a user, comprising a metallic surface (15) which is isolated from the chassis of the vehicle (V) and is connected to a high-frequency wave generator (16), so that the pair formed by the chassis of the vehicle and the said surface defines a radiating dipole, and a capacitance-variation detector (2) which is connected to the said surface and is intended to detect the variation in capacitance of a capacitor (C) formed by the (surface (15)/user's hand) pair.

20 Claims, 2 Drawing Sheets

MOTOR VEHICLE EQUIPPED WITH A SYSTEM FOR DETECTING THE APPROACH OF A USER

BACKGROUND OF THE INVENTION

The present invention relates to a motor vehicle equipped with a system for detecting the approach of a user.

Detection systems of this kind are already used in certain motor vehicles to automatically trigger the unlocking of a door lock, or authorization to open a door, as soon as the user approaches without his having to use a key or remote control. In order to carry out this automatic unlocking before opening the door, use is made of a system generally referred to as a "hands-free access system", which system activates a remote exchange of information between an identifier on the vehicle and identification carried by the user. When the identification has been recognized as correct by the identifier, the lock will be opened, thus allowing the user to open the door simply by pulling on the door handle.

However, it is inconceivable to leave the identification and/or identifier constantly activated because they consume too much electricity. Furthermore, the identification and the identifier must be capable of being activated at any time, because it is not possible to predict when the user will approach the vehicle. It has therefore already been proposed to use a system for detecting approach or gripping of the handle by the user, in order to activate the identifier of the vehicle only when the user is preparing to open the door.

It has thus been proposed to equip the door handles with an electrical contactor to detect the start of the actuation travel of the handle in order to open the door. However, this solution has the drawback of detecting the user's approach too late because the time taken by the identifier to recognize the user's identification correctly and to instruct the lock to be opened is generally much longer than the time taken by the user to complete the actuation travel of the handle. In other words, the door is generally not yet unlocked when the user has completed the actuation travel of the handle, and it is sometimes necessary to actuate the handle several times in order to successfully open the door.

It is also known to use optical or ultrasonic detection systems, but their cost is generally too high.

Document DE No. 196 17 038 describes a motor vehicle having a first electrode integrated with a door-opening handle, a second electrode on the surface of the door, a capacitive detector integrated in the door-opening handle, the capacitive detector being connected by an electrical link to the central control unit, a voltage with opposite poles being applied to the two electrodes and, in order to produce an electric field, between the opening handle and the door, the insertion of the user's hand between the two electrodes modifying the electric field, this modification being measured by the capacitive detector which can thus trigger the interrogation with a view to identifying the user. However, a system of this type needs detection of a modification in the electric field generated between two electrodes, and insertion of the hand between the two electrodes, which delays the detection.

Furthermore, all the solutions currently known need extra electrical connections between the handle and another element of the door.

SUMMARY OF THE INVENTION

The object of the invention is to eliminate the aforementioned drawbacks and to provide a motor vehicle equipped with a novel system for detecting the approach of a user, permitting detection which is early with respect to that of a handle contactor and whose cost is less than that of an optical or ultrasonic detector, without needing connection to the handle by extra electrical connection wiring or cabling.

To this end, the invention relates to a motor vehicle equipped with a system for detecting the approach of a user, characterized in that it comprises,

- a metallic surface which is isolated from the chassis of the vehicle and is connected to a high-frequency wave generator, so that the chassis of the vehicle and the surface form a radiating dipole with high impedance behaving as an untuned antenna which is underdimensioned relative to the wavelength, and
- a capacitance-variation detector which is connected to the surface and is intended to detect the variation in the capacitance of the dipole, the dipole having a capacitance which varies as a function of the capacitance of the capacitor formed by the (hand/surface) pair whose capacitance increases when the user's hand approaches the surface. This detection of capacitance variation could be processed by an electronic module, for example, integrated beforehand in the lock of a vehicle door, in order to control a variety of functions, for example the opening of door locks, as well as the transfer of information regarding the status of one lock to the other locks.

In a particular embodiment, the aforementioned surface forms part of an opening handle of an opening vehicle panel, for example a door, filler flap or boot, the handle being connected to an opening-panel lock by a mechanical link which is electrically conductive and isolated from the chassis of the vehicle in order to serve as an electrical connection between the surface and the aforementioned generator. In this case, the aforementioned dipole is formed, on the one hand, by the chassis of the vehicle and, on the other hand, by the combination of the surface and the mechanical link, which may consist, for example, of a sheathed cable or a control rod actuating a lever for opening the lock of the opening panel.

Advantageously, the detector is designed to activate an identifier on the vehicle in response to the detection of a variation in capacitance. The identifier, first checks, when it is activated, whether the user is carrying authorized identification and, second, if the check shows that the identification is recognized as correct, actuates at least one function of the vehicle, for example the opening of an opening-panel lock.

According to another embodiment, the detector is designed to activate the identifier when it detects a capacitance greater than a predetermined threshold value Cs lying between a predetermined minimum capacitance value Cmin of the dipole, corresponding for example to its residual capacitance in the user's absence, and a predetermined maximum capacitance value Cmax of the dipole, corresponding for example to its capacitance when the hand of a user is in contact with the handle. The threshold value Cs is advantageously obtained by the following formula:

$$Cs = \frac{C\min + a\ C\max}{1 + a}$$

α being a dimensionless coefficient lying between 0 and 1.

In a particular embodiment, the device includes a system for automatically recalibrating the aforementioned threshold value. For example, when the detected capacitance value remains greater than the threshold value Cs for a predetermined period of time, for example of the order of 30 s, the minimum capacitance value Cmin then assumes this new detected capacitance value. Conversely, when the detected capacitance value remains less than the minimum capacitance value Cmin for a predetermined period of time, for example of the order of 2 s, Cmin then assumes this new detected capacitance value. In the case of automatic recalibration, when the minimum capacitance value Cmin is modified, the maximum capacitance value Cmax is also modified to keep the ratio Cmax/Cmin constant.

According to yet another embodiment of the invention, the device includes a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate. If all the frequencies generated by a given series result in elementary detections which are not in agreement, the system is designed not to activate the identifier, so as to keep the locking secure.

In an advantageous embodiment, the detector is designed to detect only the imaginary part of the admittance of the dipole for a fixed frequency delivered by a stable oscillator serving as a high-frequency wave generator, in order to make the detection resistant to the presence of a more or less conductive liquid, for example salt water in contact with the handle. In this case, correct operation of the system may be obtained even when the handle is fully immersed.

Advantageously, an inductor may be provided in parallel with the equivalent impedance of the dipole and designed to eliminate from the detected capacitance value the value of the residual capacitance of the dipole in the user's absence.

According to yet another embodiment, the metallic surface may be covered with an insulator molded over it in order to protect it against external attack.

Of course, the capacitance of the dipole could as a variant also be measured using other methods: for example by inserting the capacitor into an oscillator circuit whose frequency is measured, by measuring the impulse response of the capacitor to emission of high-frequency pulses, or by measuring the modulus of the admittance of the capacitor for a fixed frequency delivered by a stable oscillator.

The stable frequency generator may be obtained from a signal linked to the clock of a microcontroller, or from the microcontroller itself, it being possible for this microcontroller to form part of an electronic module integrated with the lock.

BRIEF DESCRIPTION OF THE DRAWINGS

In order to explain the subject-matter of the invention more clearly, an embodiment thereof, represented in the appended drawing, will now be described purely by way of illustration and without implying any limitation.

In this drawing.

DETAILED DESCRIPTION OF THE INVENTION

Figure 1:
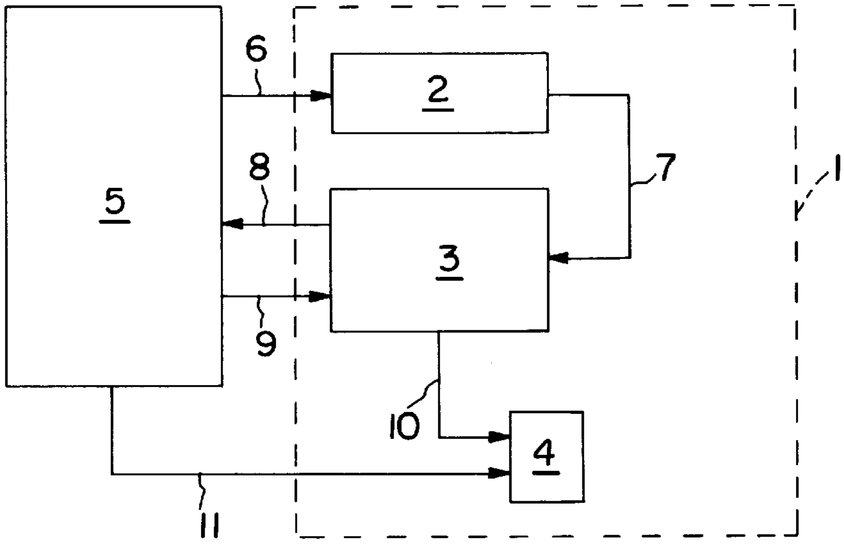
FIG. 1 is a functional block diagram of a motor vehicle according to the invention.

According to the illustrative embodiment represented in the drawing, broken lines in FIG. 1 indicate a motor-vehicle door 1 which includes a detector 2, an identifier 3 and a lock 4. The detector 2 is intended to detect the approach of a user 5 to the door 1, as indicated by the arrow 6. When the user 5 has been detected close enough to the door 1, the detector 2 emits a signal via a line 7 to the identifier 3 in order to activate it. When the identifier 3 is activated, it exchanges information signals with identification carried by the user 5, as represented by the two arrows 8, 9 with opposite directions. As soon as the identifier 3 recognizes the identification of the user 5 as correct, it sends a control signal via the line 10 to the lock 4 in order to open it. The detector 2 will have been designed so as to detect the approach of the user 5 early enough to allow the lock 4 to be opened before the user 5 actuates this lock 4 via a handle in order to open the door 1, with an action indicated by the arrow 11.

However, in the event that the unlocking has not been completed when the user finishes lifting the handle, provision may furthermore be made to use a lock which makes double action of the side-door opening handle superfluous, for example the lock described in French patent application No. 97-12539. In this case, the side door will be opened at the same time as it is unlocked.

Figure 2:
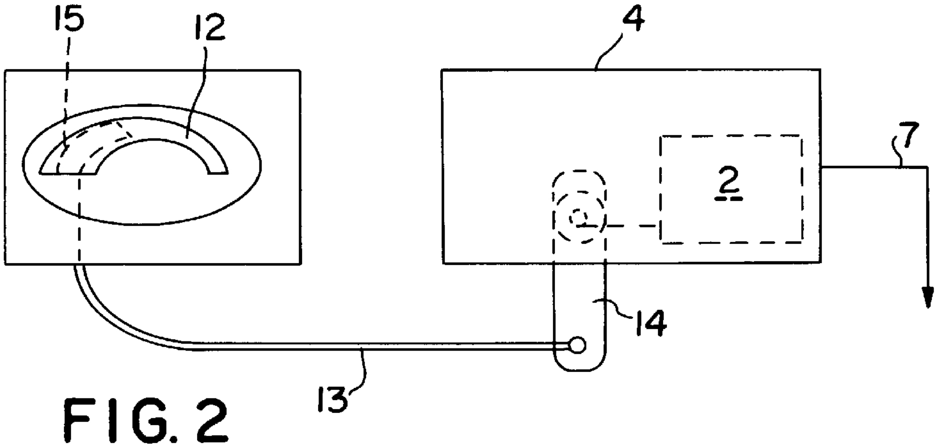
FIG. 2 is a schematic view of a door of a vehicle according to the invention.

In order to open the door 1, the user 5 must grip a door-opening handle 12 and exert a pulling force on it in order to cause the lock 4 to open, via a sheathed cable 13 or a control rod connecting the handle 12 to an opening lever 14 connected to the lock 4. As can be seen in FIG. 2, the handle 12 includes a metallic surface portion 15 which is electrically connected to the detector 2 via the cable 13 and the lever 14, which are electrically conductive and isolated from the chassis of the vehicle. The surface portion 15 may also be covered by a material molded over it in order to protect it against external attack. As a variant, the entire handle 12 may constitute the metallic surface. Through use of the mechanical link 13 between the handle 12 and the detection module 2, extra connection wiring in the door is avoided.

Figure 3:
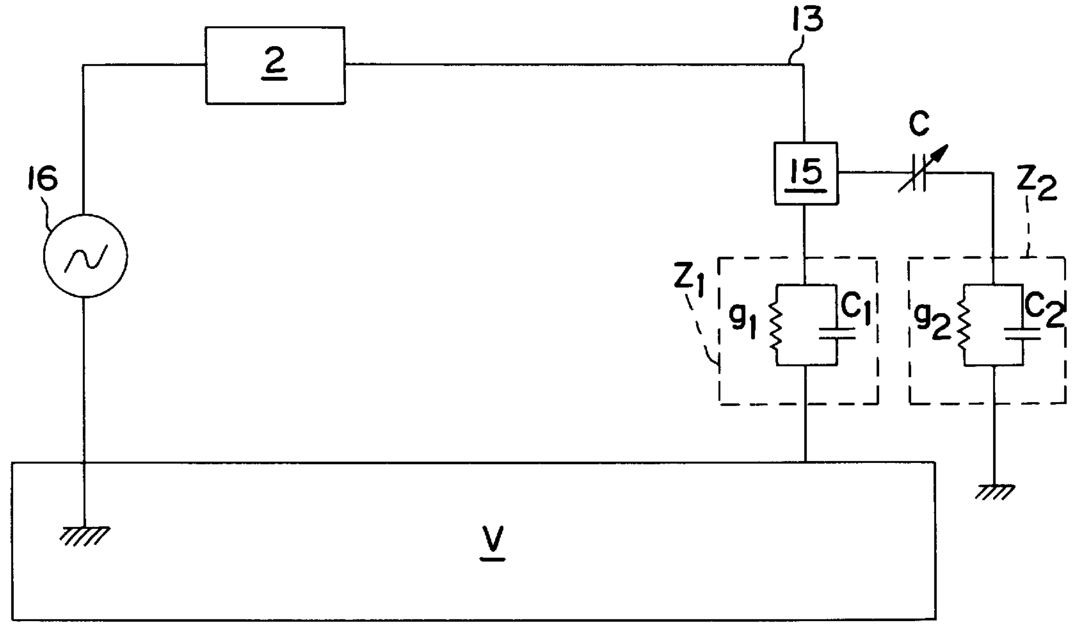
FIG. 3 is an outline circuit diagram of the detection system of a vehicle according to the invention.

Referring now to FIG. 3, it can be seen that this surface 15 is supplied with current from a high-frequency wave generator 16, which generator 16 may already be present in an electronic module M integrated with the lock 4. Under these conditions, the pair formed by, on the one hand, the vehicle V which is grounded to the chassis, and on the other hand, the combination of the surface 15 and the cable 13, defines a radiating dipole whose equivalent impedance $Z_1$ is represented in FIG. 3. This impedance $Z_1$ is generally constant and made up of a small capacitance $C_1$, resulting from the residual capacitance of the cable 13, and a parallel conductance $g_1$, the value of which represents the resistive leaks between the (handle/cable/lock) assembly and the chassis of the vehicle, it being possible for this conductance to vary depending on unforeseen leaks to the chassis, for example when water is present in the door. The value of the admittance of the dipole should be minimized in order to limit the effect of radiation around the vehicle. In other words, this dipole is designed in such a way that it behalves as an untuned antenna which is underdimensioned with respect to the wavelength output by the generator 16.

The dipole further includes, in parallel, a capacitor C with variable capacitance which is defined between the aforementioned surface 15 and the hand of the user 5. This variable capacitance C increases as the hand approaches the surface 15. When the user's hand comes into contact with the surface 15, the capacitance becomes infinite, the capacitor C disappears and the user then acts as a radiating antenna strand, which has the effect of extending the antenna and transmitting more high-frequency waves. Conversely, if an insulating mold is provided on the surface 15, there can never be direct contact between the surface 15 and the hand of the user 5. The aforementioned dipole furthermore includes, in series with the capacitor C, an impedance $Z_2$ equivalent to the user/chassis pair, this impedance $Z_2$ being generally low in comparison with C and made up of a capacitor $C_2$ in parallel with a conductance $g_2$.

Figure 4:
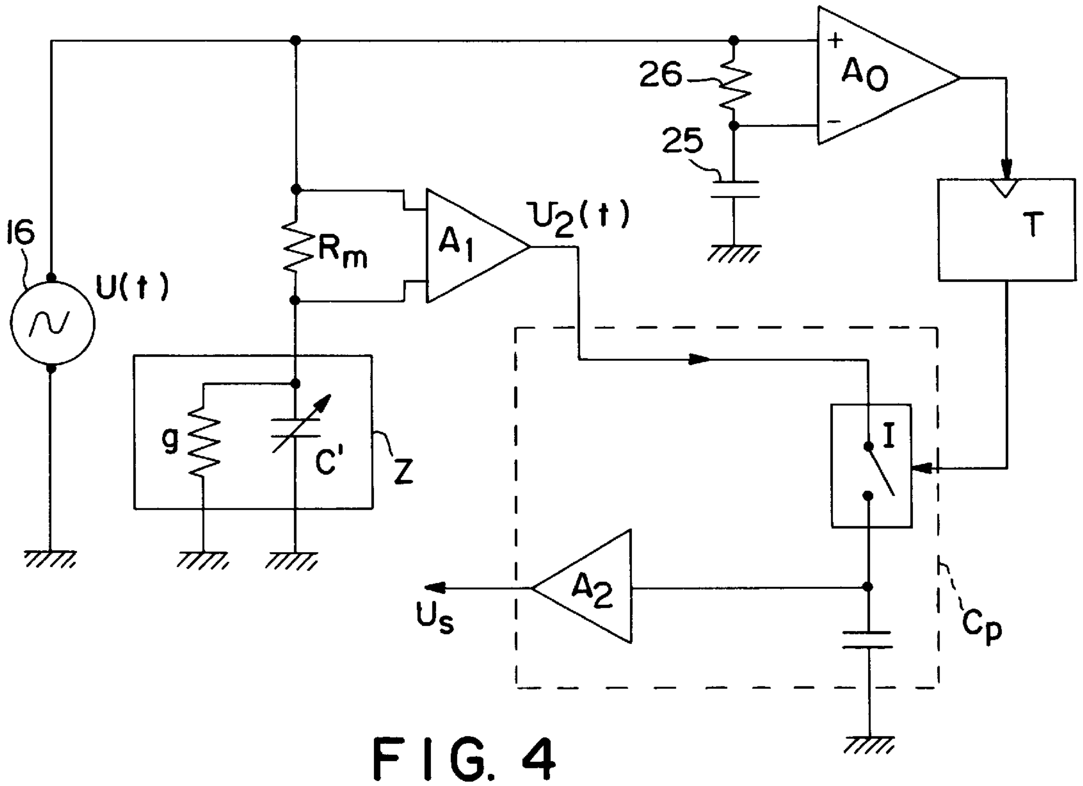
FIG. 4 is a circuit diagram giving a more detailed illustration of the detection system of a vehicle according to the invention.

Reference will now be made to FIG. 4, which represents an electronic circuit for measuring only the imaginary part of the admittance of the dipole. The act of measuring only the imaginary part of the admittance has the advantage of detecting only the capacitive part of the dipole and of circumventing the value of the resistance of the dipole, which resistance can vary in the presence of conductive liquids and therefore can vitiate the measurement to be taken. Since the frequency used is constant, the radiating dipole can be modelled by the simplified equivalent circuit diagram referenced Z. FIG. 4 shows that the equivalent impedance Z of the dipole includes a conductance g equivalent to the combination of the conductances $g_1$ and $g_2$ and, in parallel, a variable capacitance C' equivalent to the combination of the capacitances $C_1$, $C_2$ and C of FIG. 3.

The generator 16 is a stable oscillator delivering a sinusoidal voltage signal U(t), with $U(t)=U\cos(2\pi f_0 \cdot t)$. This voltage signal generates a current in the dipole Z, and this current is converted into a voltage $U_2(t)$ by an amplifier A1 connected to the terminals of a resistor $R_m$, $R_m$ being connected, on the one hand, to the generator 16 and, on the other hand, to the dipole Z.

The voltage U(t) is also applied to the positive input of a comparator $A_0$ whose negative input is connected to the average value of the signal, and therefore to a zero value, by virtue of the capacitor 25 which connects the negative input to the chassis, a resistor 26 being furthermore arranged between the two inputs of the comparator $A_0$. This comparator $A_0$ makes it possible to detect the zero crossings of the voltage U(t) and outputs a pip on each of these crossings. A monostable T detects the rising and falling edges of the output signal of $A_0$ depending on the case, and generates pulses which are sent to a pick-up circuit Cp. These pulses control an electronic switch I which receives the output signal $U_2(t)$ from the operational amplifier $A_1$. Thus, by sampling/holding, the voltage $U_2(t)$ is picked up and a voltage is obtained which, via an operational amplifier $A_2$, provides a usable output $U_5$ which makes it possible to obtain the instantaneous acquired value of the current i(to) at the time $t_o$ such that $U(t_o)=0$. This gives $i(to)=2\cdot\pi\cdot fo\cdot C'\cdot U$, where C' is the capacitance of the equivalent capacitor, U is the peak amplitude of U(t) and $f_0$ is the frequency of U(t); the current value i(to) is fully independent of the conductance g.

The electronic circuit of FIG. 4, and the way in which it operates in order to obtain just the imaginary part of the admittance of the dipole Z will not be described in further detail, and reference may in this regard be made to French patent application No. 97-11480 in the name of the Applicant Company, which is incorporated here by reference.

As a variant, instead of picking up the instantaneous value of the current at the zero crossing of the voltage signal, it is possible to measure the phase shift between the voltage and the current as well as the amplitude of the current, in order to obtain the desired capacitance value independently of the resistance, even though, in this case, a computation unit is necessary.

The advantage of the circuit in FIG. 4 is that it can be used in conjunction with the microcontroller present in the electronic module integrated with the door lock, simply by using an interface for picking up the current.

Furthermore, a high-frequency signal can be generated externally and superimposed with the measurement signals detected for a variety of reasons, for example by antenna effect, stray capacitive coupling, induction, etc. This may result in amplitude and phase beats on the measured current, as well as in random errors on the current measurements, for the high-frequency perturbations modulated by the generator. Of course, the measurements taken are not sensitive to the unpredicted phenomena referred to as "high-frequency envelope detection" which are present in unmodulated perturbations because, in this case, the measurement does not take the DC components into account.

In order to circumvent the measurement errors caused by perturbation of the radiated field type, a series of n elementary detections may be performed, n being a predetermined whole number, each detection corresponding to a different frequency $f_i$, with i lying between 0 and n. On the basis of these n measurements, the mean value will be taken, having beforehand discarded all measurements having excessive disagreement with the other measurements. This mean value will then be compared with the threshold capacitance value Cs in order to activate or not the identifier of the vehicle.

If all the frequencies result in detections which do not agree, in the case of an extreme perturbation with a very wide spectrum or of damage to part of the system, it will not be possible for a mean value to be obtained reliably, and the system will be designed to enter "by default" a status which keeps the lock closed.

The threshold capacitance value Cs is acquired when fitting the system to the vehicle, by self-learning of the minimum Cmin and maximum Cmax capacitance values which correspond respectively to a state of non-approach and a state of maximum approach of the surface 15 by the user.

The threshold value Cs will be obtained by the following formula:

$$Cs = \frac{Cmin + a\ Cmax}{1 + a} \text{ with } 0\ |\alpha|\ 1$$

The value of the coefficient α is preferably taken as less than 1 because the curve of capacitance of the capacitor as a function of the distance between the surface and the hand is of the exponential type. Therefore, in order to obtain detection of the approach of the hand when the latter is still sufficiently far away from the handle to allow the lock to be opened before the user has completed the actuation travel of the handle, it is preferable to weight the value of the minimum capacitance Cmin more than the value of the maximum capacitance Cmax. For example, the threshold capacitance value Cs will be determined in such a way that it corresponds to a distance of about 10 cm between the hand and the handle.

Figure 5:
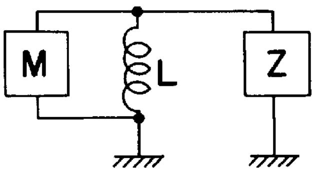
FIG. 5 represents the simplified circuit diagram of a variant of FIG. 3.

In the case of FIG. 3, Cmin will be equal to $C_1$ and Cmax will be equal at most to $C_2+C_1$. However, if the value of $C_1$ is too high in comparison with $C_2$ to obtain reliable detection of the variation in capacitance, an extra inductor L in parallel with the impedance Z of the dipole may be used (see FIG. 5) to eliminate the detection of $C_1$. For example, $L \cdot C_1 \cdot (2\pi fo)^2$ will be chosen equivalent to 1 in order to eliminate $C_1$ from the value detected by the module M and C' then becomes a function solely of C and $C_2$, with C' varying between 0 and $C_2$.

Throughout the life of the system, the automatic recalibration of Cs may be kept operational, in order to prevent the detection system from becoming blocked for an extended period in a status leading to permanent activation of the identifier, which could cause the battery of the vehicle to discharge. For example, if the vehicle is parked close enough to a wall or a post, the detected capacitance may increase accordingly and cause activation of the identifier. Therefore, provision is made that, if the detected capacitance value remains stably greater than the threshold value Cs for a determined period of time, the minimum capacitance value Cmin is replaced by this new value, so as to shift the value of the threshold capacitance Cs commensurately and thus to deactivate the identifier. Subsequently, when this perturbation is removed, the detected capacitance value returns to below Cmin, and at the end of a predetermined period of time, the system is designed to replace Cmin by this new detected value when the latter remains stable over this period of time. The minimum capacitance value Cmin thus returns to its usual reference value after a determined period of time.

It is also preferable accordingly to modify the maximum capacitance value Cmax to keep the same ratio Cmax/Cmin.

Although the invention has been described in connection with a particular embodiment, it is quite clear that it is in no way limited thereby and that it comprises all the technical equivalents to the means described, as well as their combinations, if these fall within the scope of the invention.

I claim:

1. Motor Vehicle equipped with a system for detecting the approach of a user, comprising:

a metallic surface which is isolated from a chassis of the vehicle and is connected to a high-frequency wave generator, so that the chassis of the vehicle and the surface define a radiating dipole with high impedance behaving as an untuned antenna which is underdimensioned relative to the wavelength, and a capacitance-variation detector which is connected to the metallic surface and detects a variation in a capacitance of the dipole, the capacitance of the dipole varies as a function of a capacitance of a capacitor formed by the metallic surface and the user, which capacitance increases when the user's hand approaches the surface.

2. Vehicle according to claim 1, wherein the surface forms part of an opening handle of an opening vehicle panel, the handle being connected to an opening-panel lock by a mechanical link which is electrically conductive and isolated from the chassis of the vehicle in order to serve as an electrical connection between the metallic surface and the generator.

3. Vehicle according to claim 1, wherein the detector is designed to activate an identifier on the vehicle in response to the detection of a variation in capacitance, which identifier, firstly, checks when it is activated whether the user is carrying authorized identification and, secondly, if the check shows that the identification is recognized as correct, actuates at least one function of the vehicle.

4. Vehicle according to claim 3, wherein the detector is designed to activate the identifier when it detects a capacitance greater than a predetermined threshold value Cs lying between a predetermined minimum capacitance value Cmin of the dipole, corresponding to its residual capacitance in the user's absence, and a predetermined maximum capacitance when the hand of the user is in contact with the surface.

5. Vehicle according to claim 4, wherein the threshold value Cs is obtained by the following formula:

$$Cs=C\min+a\ C\max/1+a$$

a being a dimensionless coefficient lying between 0 and 1.

6. Vehicle according to claim 5, further comprising a system for automatically recalibrating the threshold value Cs when the detected capacitance value remains stably greater than the threshold value Cs for a predetermined period of time, the minimum capacitance value Cmin then assuming this new detected capacitance value.

7. Vehicle according to claim 5, further comprising a system for automatically recalibrating the threshold value Cs when the detected capacitance value remains stably less than the minimum capacitance value Cmin for a predetermined period of time, the minimum capacitance value Cmin then assuming this new detected capacitance value.

8. Vehicle according to claim 6, further comprising a system for modifying the maximum capacitance value Cmax to keep the ratio Cmax/Cmin constant when the minimum capacitance value Cmin is modified by automatic recalibration.

9. Vehicle according to claim 1, further comprising a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate.

10. Vehicle according to claim 1, wherein the detector is designed to detect only an imaginary part of the admittance of the dipole for a fixed frequency delivered by a stable oscillator serving as the high-frequency wave generator.

11. Vehicle according to claim 10, further comprising an inductor, in parallel with the equivalent impedance of the dipole, designed to eliminate from the detected capacitance value the residual capacitance of the dipole in the user's absence.

12. Vehicle according to claim 1, wherein the metallic surface is covered with an insulator moulded over it.

13. Vehicle according to claim 2, wherein the detector is designed to activate an identifier on the vehicle in response to the detection of a variation in capacitance, which identifier, firstly, checks when it is activated whether the user is carrying authorize identification and, secondly, if the check shows that the identification is recognized as correct, actuates at least one function of the vehicle.

14. Vehicle according to claim 6, further comprising a system for automatically recalibrating the threshold value Cs when the detected capacitance value remains stably less than the minimum capacitance value Cmin for a predetermined period of time, the minimum capacitance value Cmin then assuming this new detected capacitance value.

15. Vehicle according to claim 7, further comprising a system for modifying the maximum capacitance value Cmax so as to keep the ratio Cmax/Cmi constant when the minimum capacitance value Cmin is modified by automatic recalibration.

16. Vehicle according to claim 2, further comprising a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate.

17. Vehicle according to claim 3, further comprising a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate.

18. Vehicle according to claim 4, further comprising a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate.

19. Vehicle according to claim 5, further comprising a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate.

20. Vehicle according to claim 6, further comprising a system for performing a series of elementary capacitance detections, each corresponding to different generated frequencies, the detected elementary capacitance values in a given series then being averaged, optionally discarding the spurious values, the average value then being compared with the predetermined threshold value Cs in order to activate the identifier if appropriate.

* * * * *